United States Patent [19]
Mori

[11] Patent Number: 5,903,049
[45] Date of Patent: May 11, 1999

[54] SEMICONDUCTOR MODULE COMPRISING SEMICONDUCTOR PACKAGES

[75] Inventor: Ryuichiro Mori, Tokyo, Japan

[73] Assignee: Mitsubishi Denki Kabushiki Kaisha, Tokyo, Japan

[21] Appl. No.: 09/073,836

[22] Filed: May 6, 1998

[30] Foreign Application Priority Data

Oct. 29, 1997 [JP] Japan .................................. 9-297288

[51] Int. Cl.⁶ .................................................. H01L 23/02
[52] U.S. Cl. ............................ 257/686; 257/685; 361/730
[58] Field of Search ..................................... 257/678, 684, 257/685, 686, 687, 688, 690, 700, 707, 712, 713, 777, 778, 780, 781, 784, 796; 361/790

[56] References Cited

U.S. PATENT DOCUMENTS 5,373,189   12/1994   Massit et al. ............................ 257/686
5,631,497   5/1997   Miyano et al. ........................... 257/707

*Primary Examiner*—Tom Thomas
*Assistant Examiner*—Luan Thai
*Attorney, Agent, or Firm*—McDermott, Will & Emery

[57] ABSTRACT

Each of two semiconductor elements 1a or 1b is connected to wiring patterns 3a or 3b on an element substrate 2a or 2b via a bump 4a or 4b, respectively. These members are sealed off by sealing resin to form a semiconductor package 6a or 6b, and the same are disposed on a mounting substrate 8 one above the other with an adhesive agent 9 applied thereto. A portion of the wiring pattern 3a not covered by the sealing resin 5, which portion is connected to the semiconductor element 1a, a portion of the wiring pattern 3b connected to the semiconductor element 1b, and an electrode on the mounting substrate 8 are electrically interconnected by connecting wires 7.

3 Claims, 2 Drawing Sheets

SEMICONDUCTOR MODULE COMPRISING SEMICONDUCTOR PACKAGES

FIELD OF THE INVENTION

The present invention relates to a semiconductor module with a semiconductor package of a resin-sealed type mounted thereon.

BACKGROUND ART

FIG. 4 is a sectional view of a conventional semiconductor module. Referring to FIG. 4, the conventional semiconductor module comprises a semiconductor element 1 mounted on a mounting substrate 8 by use of an adhesive agent 9. A conductive wire 7 electrically connects an electrode (not shown) formed on the semiconductor element 1 with an electrode (not shown) formed on the mounting substrate 8. A sealing resin 10 protects the semiconductor element 1 on the mounting substrate 8.

The semiconductor module is formed by fixing the semiconductor element 1 directly onto the mounting substrate 8 using the adhesive agent 9. A conductive wire is applied between an electrode (not shown) on the semiconductor element 1 and an electrode (not shown) on the mounting substrate 8. The sealing resin 10 is applied over the semiconductor element 1 and the conductive wire 7 to protect them from the surrounding environment. In this way, the mounting area of the semiconductor element 1 may be reduced, and the weight of the semiconductor module may also be reduced.

SUMMARY OF THE INVENTION

In the conventional semiconductor module as described above, it is difficult technically and economically to test the semiconductor element itself separately, due to handling difficulties. Thus, there has been a problem in that, since the quality of the semiconductor element 1 cannot be determined, defects in the module can be found only after the module has been assembled. As a result, the yield of the semiconductor module is lowered and its cost is raised.

Further, with demand for smaller lighter portable electronic devices, such as portable personal telephones and portable personal computers, there is a demand for smaller-sized semiconductor modules with miniaturized components and semiconductor packages with decreased mounting area and volume.

The present invention was made to solve the above mentioned problem, and it is an object of the present invention to provide a semiconductor module allowing separate testing of the semiconductor element to be easily carried out, and to provide a high density semiconductor module having a plurality of semiconductor packages of assured reliability mounted therein.

According to one aspect of the present invention, a semiconductor module comprises a mounting substrate for mounting at least a semiconductor package thereon and having at least an electrode thereon. A plurality of semiconductor packages are piled and fixed onto the mounting substrate. Each of the semiconductor packages includes: an element substrate; a semiconductor element having at least an electrode fixed onto the element substrate; a wiring pattern formed on the element substrate and electrically connected with the electrode of the semiconductor element; and sealing resin for sealing off the semiconductor element, the sealing resin overlying the element substrate except an end portion of the wiring pattern. Further, a plurality of connecting wires are provided for connecting each end portion of the wiring pattern led out of the sealing resin and the electrode on the mounting substrate.

In another aspect of the present invention, the semiconductor module further comprises a bump disposed on the element substrate for connecting the electrode of the semiconductor element with the wiring pattern formed on the element substrate.

In another aspect of the present invention, the semiconductor module further comprises a heat radiating mechanism interposed between adjoining semiconductor packages piled up on the mounting substrate.

Other and further objects, features and advantages of the invention will appear more fully from the following description.

DESCRIPTION OF THE INVENTION

This invention will be described in further detail by way of example with reference to the accompanying drawings.

First Embodiment

Figure 1:
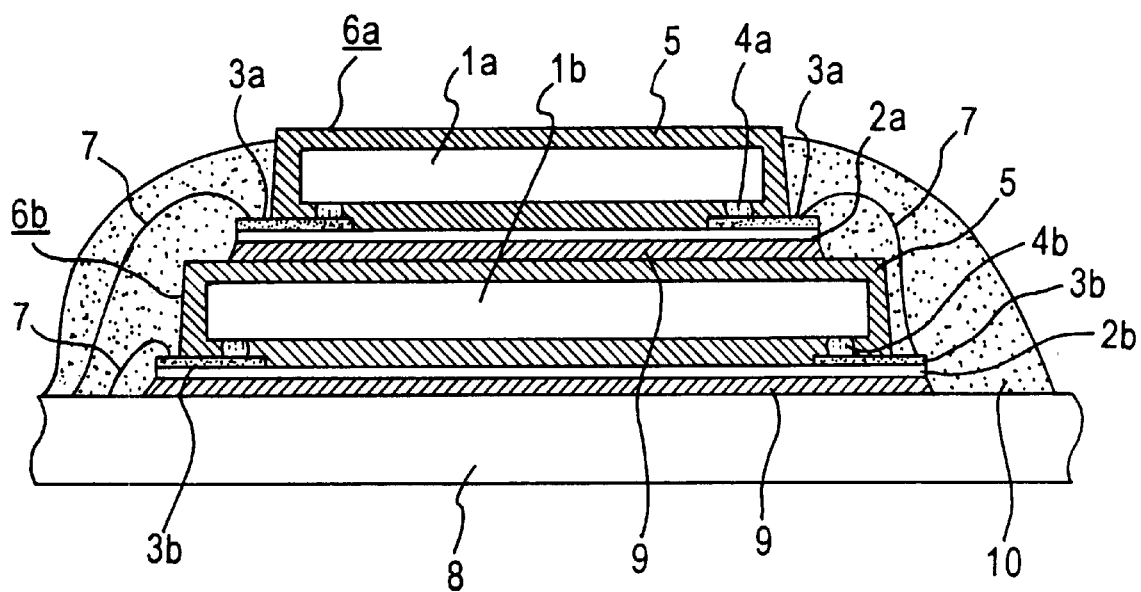
FIG. 1 is a sectional view of a semiconductor module according to a first embodiment of the invention.

A first embodiment of the present invention, a semiconductor module having semiconductor packages of a resin-sealed type mounted therein, will now be described with reference to the accompanying drawings. FIG. 1 is a sectional view showing a semiconductor module according to a first embodiment of the invention, and FIG. 2 is a sectional view showing a semiconductor package mounted in the semiconductor module shown in FIG. 1.

Referring to the drawings, reference numerals 1a, 1b and 1 denote a semiconductor element; 2a, 2b and 2 denote an element substrate; 3a, 3b and 3 denote a wiring pattern formed on the element substrate 2a, 2b and 2; and 4a, 4b and 4 denote a bump. Further, reference numeral 5 denotes a sealing resin for sealing off the semiconductor elements 1a, 1b, 1; 6a, 6b and 6 denote a semiconductor package. Still further, reference numeral 7 denotes a wire, 8 denotes a mounting substrate, 9 denotes an adhesive agent, and 10 denotes a sealing resin for sealing off the semiconductor packages 6a and 6b mounted on the mounting substrate 8.

Figure 2:
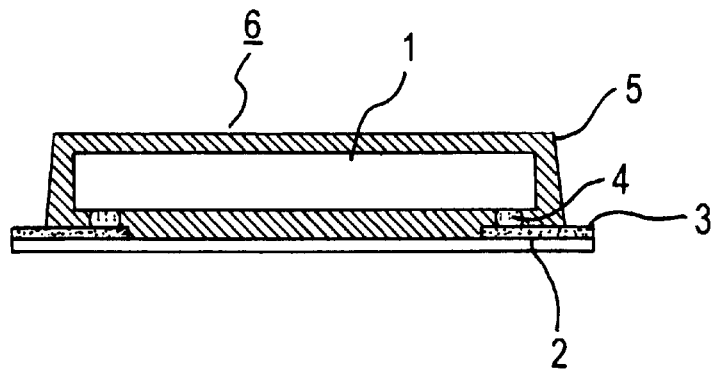
FIG. 2 is a sectional view of a semiconductor package mounted in the semiconductor module shown in FIG. 1.

In the case of semiconductor package 6 mounted in the semiconductor module of the present embodiment, electrodes (not shown) formed on the semiconductor element 1 and the wiring pattern 3 on the element substrate 2 are electrically connected by the bumps 4, as shown in FIG. 2. The semiconductor element 1 and the bumps 4 are protected from the surrounding environment by the sealing resin 5. Further, the element substrate 2 is made somewhat larger in size than the semiconductor element 1. The other end of the wiring pattern 3 connected with the bump 4 is led out of the sealing resin 5. The semiconductor package 6 of the described structure is slightly larger than the semiconductor element 1 in size, and the semiconductor element 1 is sealed off with resin. Therefore, testing of the semiconductor element 1 can be easily carried out separately or independently.

The semiconductor module of the present embodiment is assembled as follows. Semiconductor elements 1a and 1b are respectively connected to wiring patterns 3a and 3b on substrates 2a and 2b by bumps 4a and 4b. Semiconductor elements 1a and 1b are respectively sealed off by sealing resin 5 to form semiconductor packages 6a and 6b. Semiconductor package 6b is fixed onto mounting substrate 8 with adhesive agent 9, and semiconductor package 6a is fixed onto semiconductor package 6b with adhesive agent 9. Wiring pattern 3a is connected with semiconductor element 1a and led out of sealing resin 5. Wiring pattern 3b is connected with semiconductor element 1b and led out of sealing resin 5. Wiring pattern 3a and wiring pattern 3b are electrically connected with each other by a connecting wire 7. The wiring pattern 3a led out of sealing resin 5 and an electrode (not shown) on mounting substrate 8 are electrically connected with each other by a connecting wire 7. Wiring pattern 3b led out of the sealing resin 5 and the electrode (not shown) on the mounting substrate 8 are electrically connected with each other by another connecting wire 7. Further, semiconductor packages 6a and 6b mounted on mounting substrate 8 and connecting wires 7 are sealed off by sealing resin 10.

According to the present invention, semiconductor packages 6a and 6b are constructed by sealing off semiconductor elements 1a and 1b, which are electrically connected to wiring patterns 3a and 3b on substrates 2a and 2b using bumps 4a and 4b. Portions of wiring patterns 3a and 3b are led out of the sealing resin. Semiconductor packages 6a and 6b are only slightly larger in size than semiconductor elements 1a and 1b, and the reliability thereof is assured. Semiconductor packages 6a and 6b as formed above are mounted on mounting substrate 8, one above the other. Thus, the mounting area of semiconductor package 6a and semiconductor package 6b are greatly reduced, and the size of the semiconductor module is also greatly reduced.

Second Embodiment

Figure 3:
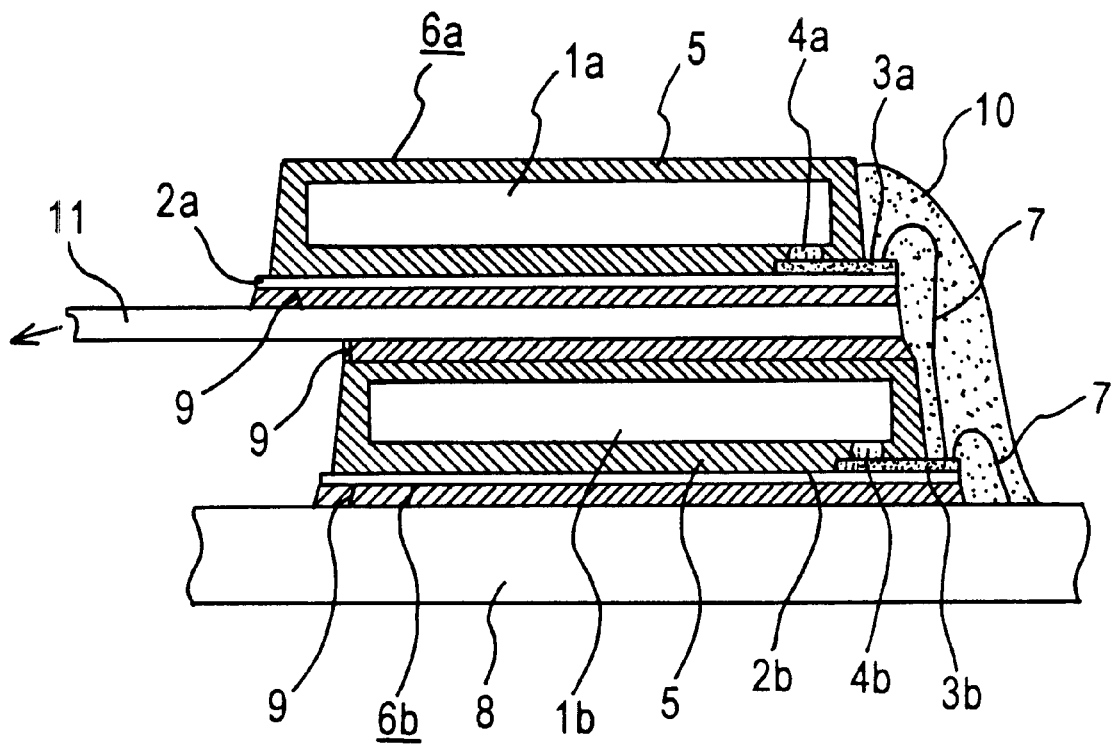
FIG. 3 is a sectional view of a semiconductor module according to a second embodiment of the present invention.
Figure 4:
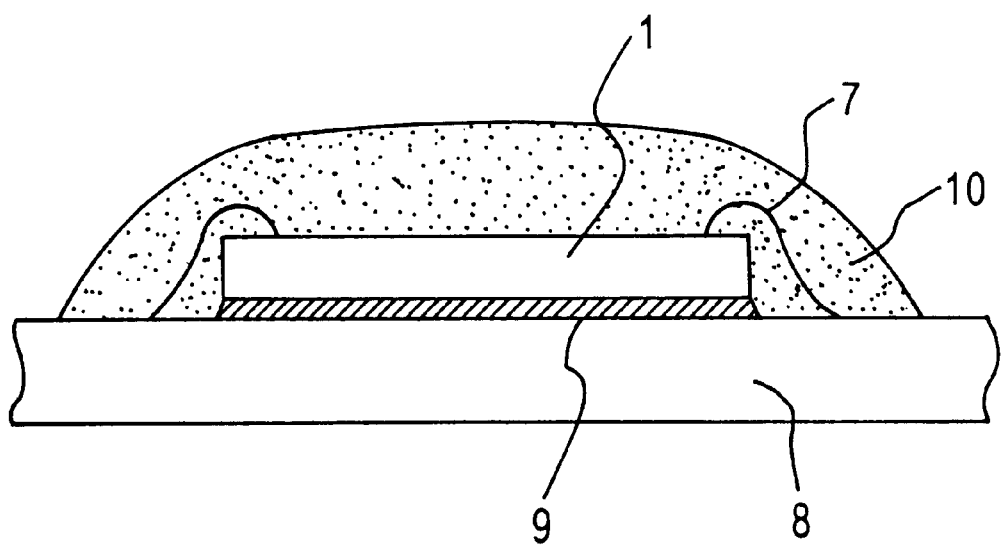
FIG. 4 is a sectional view of a conventional semiconductor module.

FIG. 3 is a sectional view of a semiconductor module according to a second embodiment of the present invention. Referring to FIG. 3, reference numeral 11 denotes a heat radiating mechanism fixed with an adhesive agent 9 between the semiconductor package 6a and the semiconductor package 6b mounted on the mounting substrate 8 one above the other. Other particulars of the structure are the same as the first embodiment, so their description will be omitted.

According to the present embodiment, a heat radiating mechanism (for example, a radiating plate) is interposed between semiconductor package 6a and semiconductor package 6b mounted on mounting substrate 8 one above the other, and the heat radiating mechanism is fixed to both the semiconductor packages 6a and 6b with adhesive agent 9. Therefore, in addition to the advantages the first embodiment, in this embodiment a temperature rise of semiconductor elements 1a and 1b due to heat generation during high speed operation may be prevented.

The effects and advantages of the present invention may be summarized as follows.

According to the present invention, as described above, a semiconductor element is electrically connecting with a wiring pattern on a substrate by using bumps. The semiconductor element and the wiring pattern are sealed off to construct a semiconductor package. A plurality of such semiconductor packages are disposed on a mounting substrate one above another, and the semiconductor packages are connected to the mounting substrate using portions of the wiring patterns led out of the sealing resin. Accordingly, the reliability of the semiconductor elements can be assured while they are in the semiconductor package stage. The mounting area of the semiconductor packages is also greatly reduced. Thus, a highly reliable and smaller semiconductor module is obtained.

Further, according to the present invention, a heat radiating mechanism can be interposed between the semiconductor packages placed on the mounting substrate one above the other. Accordingly, the temperature of the semiconductor elements can be prevented from rising due to heat generated during high speed operation.

Obviously many modifications and variations of the present invention are possible in the light of the above teachings. It is therefore to be understood that within the scope of the appended claims the invention may by practiced otherwise than as specifically described.

What is claimed is:

1. A semiconductor module, comprising:

a mounting substrate for mounting at least one semiconductor package thereon and having at least one electrode thereon;

a plurality of semiconductor packages stacked and fixed onto said mounting substrate; each said semiconductor package including:
an element substrate;
a semiconductor element, having at least an electrode, fixed onto said element substrate;
at least one wiring pattern formed on said element substrate and electrically connected with said electrode of said semiconductor element; and
a sealing resin contacting and substantially encapsulating said semiconductor element, said sealing resin overlying said element substrate except at an end portion of said wiring pattern; and
a plurality of connecting wires, each connecting said end portion of said wiring pattern and said electrode on said mounting substrate.

2. The semiconductor module according to claim 1, further comprising a bump disposed on said element substrate for connecting said electrode of said semiconductor element with said wiring pattern formed on said element substrate.

3. The semiconductor module according to claim 1, further comprising a heat radiating mechanism interposed between adjoining semiconductor packages stacked up on said mounting substrate.

* * * * *